United States Patent [19]

Sauvagerd et al.

[11] Patent Number: 5,257,292
[45] Date of Patent: Oct. 26, 1993

[54] CIRCUIT ARRANGEMENT FOR INFLUENCING THE FREQUENCY RESPONSE OF A DIGITAL AUDIO SIGNAL

[75] Inventors: Ulrich Sauvagerd; Bernd Strassenburg, both of Hamburg, Fed. Rep. of Germany

[73] Assignee: U.S. Philips Corporation, New York, N.Y.

[21] Appl. No.: 851,457

[22] Filed: Mar. 16, 1992

[30] Foreign Application Priority Data

Mar. 21, 1991 [DE] Fed. Rep. of Germany ....... 4109211

[51] Int. Cl.$^5$ .............................................. H04B 1/10
[52] U.S. Cl. ...................... 375/103; 375/14; 364/724.19
[58] Field of Search ................ 375/103, 11, 14; 364/724.01, 724.19, 724.2, 724.17

[56] References Cited

U.S. PATENT DOCUMENTS 4,910,799  3/1990  Takayama ........................... 375/103
4,953,186  8/1990  Levy et al. ........................... 375/14
5,150,317  9/1992  Countryman ..................... 364/724.01

*Primary Examiner*—Curtis Kuntz
*Assistant Examiner*—Hai H. Phan
*Attorney, Agent, or Firm*—Edward W. Goodman

[57] ABSTRACT

In a digital circuit arrangement for influencing the frequency response of a digital audio signal, dependent on the frequency and/or amplitude, the input signal of the circuit arrangement is applied to a signal filter (3) having variable filter coefficients, while its output signal represents the frequency response-influenced output signal of the circuit arrangement after addition to the input signal of the circuit arrangement, and the coefficients for the signal filter are selected in dependence upon the output signal of a control branch which receives the input signal of the circuit arrangement and includes a control filter (7), a rectifier (8), a pulse shaper stage (9), a logarithmation circuit (12) and a circuit (6) for determining the coefficients.

16 Claims, 2 Drawing Sheets

CIRCUIT ARRANGEMENT FOR INFLUENCING THE FREQUENCY RESPONSE OF A DIGITAL AUDIO SIGNAL

BACKGROUND OF THE INVENTION

1. Field of the Invention

The invention relates to a digital circuit arrangement for influencing the frequency response of a digital audio signal, dependent on the frequency and/or amplitude.

2. Description of the Related Art

Circuit arrangements of this type are particularly required in noise-reduction systems used for reducing the noise produced after a sound carrier has been recorded and subsequently reproduced. Such known systems are, for example the dbx, the HIGHCOM system and the various Dolby systems. In the latter noise-reduction systems, a predetermined filter characteristic is adjusted relative to regards its starting point and the extent of its effect on the audio signal, dependent on the frequency and the amplitude of a signal. Such systems are generally referred to as "Sliding Band Systems".

An encoder which raises, for example, the upper frequency range of the audio signal at the recording end in dependence upon the frequency and/or amplitude of a signal, and a decoder which, in reverse, lowers the same frequency range again at the reproducing end are provided for these noise-reduction systems.

It is known that only analog circuit arrangements are used for most noise-reduction systems of the type described above. The reason is that these circuit arrangements are generally used for analog audio signals only. However, digital apparatuses for reproducing audio signals have increasingly been commercially available in the last few years, which apparatuses should also be capable of reproducing, inter alia, analog audio signals. Hence, it is desirable to provide a digitally operating circuit arrangement which, in conformity with a noise-reduction system, can influence the frequency response of the digital audio signal in dependence upon the frequency and/or amplitude.

SUMMARY OF THE INVENTION

According to the invention this object is achieved in that the input signal of the circuit arrangement is applied to a signal filter having variable filter coefficients, while its output signal represents the frequency response-influenced output signal of the circuit arrangement after addition to the input signal of the circuit arrangement, and in that the coefficients for the signal filter are selected in dependence upon the output signal of a control branch which receives the input signal of the circuit arrangement and comprises a control filter, a rectifier, a pulse shaper stage, a logarithmation means and a circuit for determining the coefficients, said circuit supplying the filter coefficients for the signal filter.

In contrast to the known analog circuit arrangements, the circuit arrangement according to the invention does not operate recursively, because this presents problems in digital systems. However, the circuit arrangement should be capable of simulating the properties of analog' systems, not only as regards the amplitude behavior but also as regards the pulse behavior. A fundamental problem in this connection is that the desired frequency and/or amplitude-dependent frequency response characteristic curves are not given as standard curves, but that basic features of given analog circuit arrangements are prescribed for most noise-reduction systems. The behavior of these circuit arrangements is not defined but emanates, as it were, automatically from their structure. If the behavior of these analog circuit arrangements is quasi-simulated for the digital range, a corresponding digital circuit arrangement will have to be very flexible, i.e. it should be possible to obtain a substantially arbitary amplitude and/or pulse behavior. If a given characteristic of a given noise-reduction system is to be simulated, the corresponding frequency response curves and the dynamic behavior of the circuit can only be determined experimentally.

In the digital circuit arrangements according to the invention these requirements are met in that a signal filter is provided which operates with variable filter coefficients. Dependent on the frequency and/or amplitude of the input signal of the circuit arrangement, these filter coefficients can be adjusted as desired. This applies to the static case, i.e. when there is an input signal of constant frequency and amplitude, as well as to the dynamic case, i.e. when the frequency and/or amplitude of the input signal varies.

The coefficients for the signal filter are selected in a control branch to which the input signal of the circuit arrangement is applied. This control branch includes a control filter preceding a rectifier. The output signal of the rectifier reaches a pulse shaper stage which precedes a logarithmation means. Dependent on the output signal of the logarithmation means, the coefficients are adjusted in a circuit for determining the coefficients.

Dependent on the desired influence on the frequency response and the desired dynamic behavior, the individual components of the circuit arrangement have different structures.

For example, as regards its filter characteristic, the signal filter should be adapted to the desired frequency response to be adjusted in dependence upon the frequency and/or amplitude of the input signal. The control filter in the control branch defines both the static and the dynamic behavior of the circuit arrangement. The filter curve of this filter is to be formed in such a manner that the filter coefficients for the signal filter can be varied as desired. The pulse shaper determines the dynamic behavior. This is realized in that the rise time and/or decay time constants of the signals from the control filter can be influenced in the pulse shaper. The selection of these time constants determines with which minimum time constants the filter coefficients are adjusted at the new amplitude or frequency after an amplitude and/or frequency jump of the input signal of the circuit arrangement. Since these values, likewise as the desired frequency response for the signal filter and the characteristic curves for the control filter are different, dependent on the desired influence on the frequency response, it is not possible to indicate general rules for these values. In most cases the components and filter characteristics should be selected experimentally.

The circuit arrangement provides the possibility of using quasi-arbitrary characteristics for influencing the frequency response. Only the filter characteristics and the coefficients, as well as the pulse shaper stage should be adapted for this purpose. Despite this great variability, the circuit arrangement has a simple structure.

In an embodiment of the invention, the pulse shaper comprises a rise time filter and a decay time filter, which are low-pass filters and influence the pulse behavior of the signals through the pulse shaper in such a way that the rise time filter defines the minimum time constant of rising edges of the signal and the decay time filter defines the minimum time constant of falling edges of the signal.

The rise time filter and the decay time filter define the minimum time constants of the edges of the signal through the pulse shaper. The time constant of the rise time filter defines the slope of rising edges of the signal. The decay time filter defines the time constant of the falling edges. The dynamic behavior of the circuit arrangement is influenced by these two filters. After a frequency and/or amplitude jump of the input signal of the circuit arrangement it is often undesirable to adapt the frequency characteristic of the signal filter immediately to the new amplitude and/or frequency. This transition is rather realized with a multiple delay. This delay time, with which the new frequency and/or amplitude are adjusted for influencing the frequency response, can be adjusted by means of the time constants of the rise time filter as well as of the decay time filter.

In a further embodiment of the invention, the rise time filter operates with a time constant which is varied in dependence upon the amplitude of the signal applied to said filter and the filter operates with smaller time constants towards larger amplitudes of the signal.

In many noise-reduction circuits, for which the digital circuit arrangement may be used, the time constants for the dynamic behavior are to be selected differently, dependent on the amplitude of the input signal of the circuit arrangement. For this case the rise time filter may advantageously operate with a variable constant which is varied in dependence upon the amplitudes of the signal.

In a further embodiment, the rise time filter is a first-order digital filter having the transfer function $$H(e^{j\omega T}) = \frac{e_0 + e_0 e^{-j\omega T}}{1 + f_1 e^{-j\omega T}}$$

where: $T = 1/F$, $F$ = sampling frequency of the digital audio signal, $e_0 = k_1$ + output signal of the filter, $f_1 = k_2$ + inverted output signal of the filter.

In general, the rise time filter should be designed as a first-order digital filter. Such a filter operates with four filter coefficients. However, two coefficients are sufficient for the envisaged use so that only the coefficients $e_0$ and $f_1$ have to be adjusted. In order to adapt the characteristic of the rise time filter to the amplitude of the input signal, the coefficient $e_0$ is composed of a constant value $k_1$ and the output signal of the filter. The coefficient $f_1$ is composed of a constant value $k_2$ and the inverted output signal of the filter. In this way it is achieved that the two filter coefficients in $e_0$ and $f_1$ are varied in dependence upon the signal amplitude.

In further embodiments of the invention, the control filter is a high-pass filter designed as a first-order digital filter having the transfer function $$H(e^{j\omega T}) = \frac{c_0 + c_1 e^{-j\omega T}}{1 + d_1 e^{-j\omega T}}$$

where $T = 1/F$, $F$ = sampling frequency of the digital audio signal, and filter coefficients $c_0$, $c_1$, $d_1$ have constant values.

The dimensioning of the filter coefficients $c_0$, $c_1$ and $d_1$ determines the static behavior as well as the dynamic behavior of the circuit arrangement.

In a further embodiment of the invention, the signal filter may be designed as a first-order digital filter having the following transfer function:

$$H(e^{j\omega T}) = \frac{a_0 - a_0 e^{-j\omega T}}{1 + b_1 e^{-j\omega T}}$$

where $T = 1/F$, $F$ = sampling frequency of the digital audio signal, while the coefficients $a_0$ and $b_1$ of the filter are variable and are selected in dependence upon the output signal of the control branch.

Two filter coefficients $a_0$ and $b_1$, which are variable, however, are sufficient in this case. These filter coefficients are selected in dependence upon the output signal of the control branch. These coefficients should be selected in such a way that the desired frequency response characteristics can be realized by means of the output signal of the signal filter which is added to the input signal of the circuit arrangement. Since the theoretical determination of these values is also extremely elaborate, it is best to determine them by experiment.

In a further embodiment of the invention, the circuit for determining the coefficients comprises a read-only memory which is controlled by the output signal of the logarithmation means, while 100 values of the filter coefficients required for the signal filter are stored in said read-only memory.

The required filter coefficients may be stored in a simple manner in a read-only memory from which they are read, dependent on the output signal of the logarithmation means. It is generally sufficient to store 100 values for the two filter coefficients. Thus, at least 100 different frequency response curves can be obtained in this way. It has been found that this gradation in the different frequency response curves is generally no longer audible and is sufficient for most noise-reduction systems.

In a further embodiment of the invention, the circuit for determining the coefficients computes the filter coefficients required for the signal filter in dependence upon the output signal of the logarithmation means by means of predetermined mathematical equations.

Instead of using a read-only memory, the filter coefficients can be advantageously computed in the circuit for determining the coefficients. Mathematical equations with which the filter coefficients can be computed are to be used for this purpose. As compared with the embodiment using the read-only memory, this embodiment particularly provides advantages if the overall circuit arrangement must have a good distortion behavior so that a great many filter coefficients are required.

For the above-described signal filter with two filter coefficients only, these filter coefficients can be advantageously computed by means of the following equations $$a_0 = L_1 \times f(z) + L_2$$

$$b_1 = L_3 \times f(z) + L_4$$

in which $f(z)$ is the output signal of the logarithmation means and in which $L_1$ to $L_4$ have predetermined constant values.

The circuit arrangement according to the invention, which can be advantageously controlled by means of a digital signal processor, may particularly be used for influencing the frequency response in conformity with the characteristics of analog noise-reduction circuits. An example of such circuits is the Dolby-B system. For example, for decoding in conformity with the characteristics of analog Dolby-B circuits, it is sufficient to implement the signal filter as a first-order low-pass filter.

In some noise-reduction systems, for example the Dolby-B system, the signal is limited at the encoder end, when given amplitude values are exceeded. This limitation must be cancelled again at the reproducing end, thus at the decoder end. A further embodiment of the invention is therefore characterized in that, prior to addition to the input signal of the circuit arrangement, the output signal of the signal filter is applied to a multiplier in which the signal is multiplied by a value of 1 when it falls below a predetermined amplitude value and is multiplied by a value of slightly more than 1 when it exceeds the predetermined amplitude value, and in that a limiting function in the encoding process of the digital signal is activated in response to exceeding the predetermined amplitude value.

In accordance with further embodiments of the invention, the circuit arrangement may also be used for more complex noise-reduction systems, for example, for generating frequency response characteristics in accordance with analog Dolby-C circuits. On the one hand, it is possible that two circuit arrangements according to the invention, operating independently of each other, are arranged one after the other. On the other hand, it is possible to implement the signal filter and the control filter as second-order digital filters; one circuit arrangement according to the invention is then sufficient.

BRIEF DESCRIPTION OF THE DRAWINGS

An embodiment of the invention will be described in greater detail with reference to the accompanying drawings, in which.

DESCRIPTION OF THE PREFERRED EMBODIMENT

Figure 1:
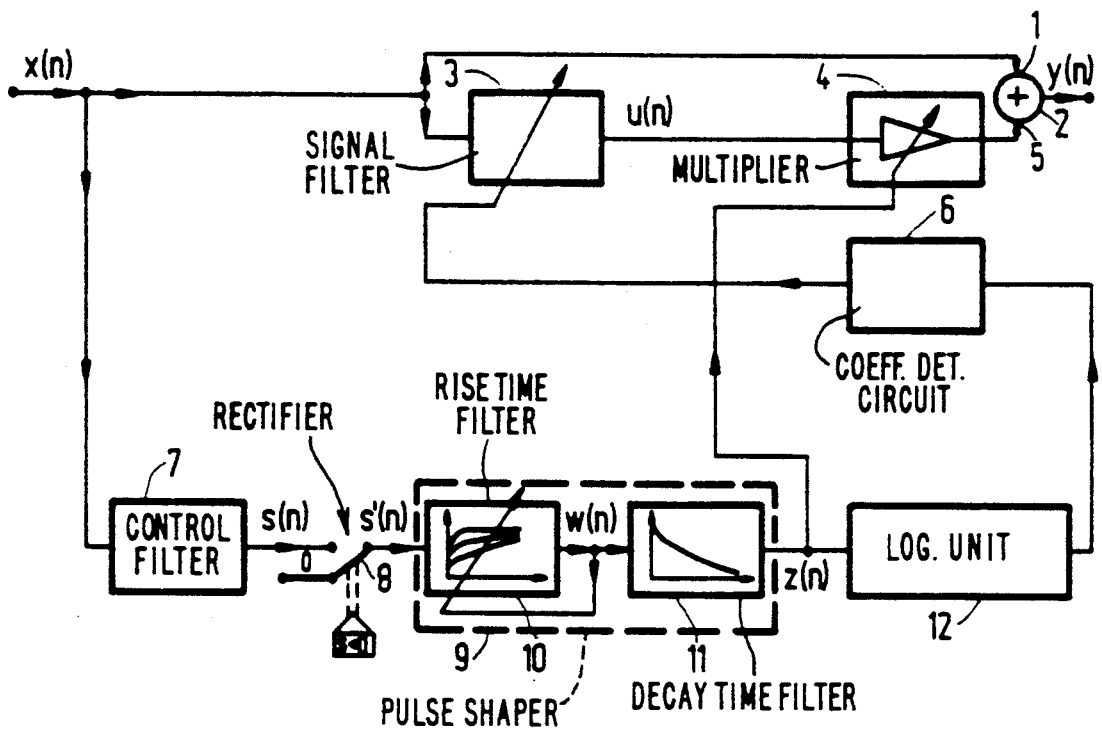
FIG. 1 is a block diagram of a digital circuit arrangement operating as a Dolly-B decoder for influencing the frequency response of a digital audio signal, dependent on the frequency and/or amplitude.

A digital circuit arrangement shown in a block diagram in FIG. 1 is formed as a decoder which generates frequency response characteristics in accordance with the Dolby-B system. To this end the circuit arrangement receives a digital audio signal $x(n)$ which may be, for example, an audio signal converted from the analog to the digital range.

This signal is applied within the circuit arrangement to a first input 1 of an adder 2 and to a signal filter 3. The output signal of the signal filter 3 is applied to a multiplier 4 whose output signal is applied to a second input 5 of the adder 2. The output signal of the adder 2, which is denoted by $y(n)$ in the Figure, represents the decoded output signal of the circuit arrangement.

The digital audio signal thus traverses a main branch in which it is not influenced and a sub-branch in which it passes through the signal filter 3 and the multiplier 4. The signals of the main branch and the sub-branch are added and constitute the output signal $y(n)$ of the circuit arrangement.

The signal filter 3 is used to influence the frequency response of the signal $x(n)$ in the desired manner, dependent on its frequency and amplitude. A first-order low-pass filter is used which has variable filter coefficients for influencing the frequency response as desired. The filter coefficients for the signal filter 3 are applied to this filter from a circuit 6 for determining the coefficients. This coefficient-determining circuit 6 is controlled by the output signal of a control branch which will hereinafter be described in greater detail.

The control branch, whose input receives the input signal of the circuit arrangement $x(n)$, includes a control filter 7 which is a first-order digital filter operating with constant filter coefficients. The characteristic of this filter influences the static behavior as well as the dynamic behaviour of the circuit arrangement. If, as in the example shown in the drawing, the circuit arrangement is to operate as a decoder for a Dolby-B system, this filter should be implemented as a high-pass filter.

The output signal of the control filter 7, denoted by $s(n)$ in the Figure, is applied to a rectifier shown as a switch 8 in the Figure, which suppresses signal values $s(n)<0$. The signal thus rectified and denoted by $s'(n)$ in the Figure is subsequently applied to a pulse shaper stage 9. In the pulse shaper stage 9 the rise and decay times of the signal $s'(n)$ applied to this stage are given time constants. To this end a rise time filter 10 is arranged within the pulse shaper stage 9, which filter determines the minimum time constants of rising edges of the signal applied thereto. The rise time filter 10 is a variable filter whose filter coefficients are selected in dependence upon its output signal $w(n)$. The rise time filter 10 within the pulse shaper stage 9 precedes a decay time filter 11 which operates with a fixed time constant, hence with fixed predetermined filter coefficients. This filter determines the minimum time constant of falling edges of the signal $w(n)$ applied thereto. The output signal of the decay time filter 11, which signal is denoted by $z(n)$ in the Figure, represents the output signal of the pulse shaper stage 9 and is subsequently applied to a logarithmation means 12 in which this signal is logarithmated. It is preferably a modified logarithmation means which computes the output signal $f(z)$ from the output signal Z of the pulse shaper stage 9 in accordance with the equation $f(z) = A + Bz^{\frac{1}{2}} + Cz^{\frac{1}{4}} + Dz$, in which A, B, C and D are constant values. The output signal of the logarithmation means 12 represents a kind of vector which is applied to the circuit 6 for determining the coefficients and which triggers the desired selection of the filter coefficients for the signal filter 3 within this read-only memory.

The behavior of the circuit arrangement shown in FIG. 1 can be arbitrarily adjusted to the desired manner of influencing the frequency response. It is evident that the signal filter 3 and the variable filter coefficients applied thereto should be implemented in such a way that the desired characteristics for influencing the frequency response can be used after addition in the adder 2 with the input signal of the circuit arrangement. The selection of the filter coefficients in the circuit 6 for determining the coefficients is realized by means of the control branch. In this control branch the control filter 7 influences both the static and the dynamic behavior of the circuit arrangement. As regards the static behavior, the pulse shaper stage 9 is quasi-inoperative. If an input signal $x(n)$ of constant frequency and amplitude is provided, a given coefficient pair is selected via the signal filter and the then inoperative pulse shaper stage 9 after logarithmation of its output signal in the coefficient-determining circuit 6 and the signal filter 3 is adjusted to influence the frequency response as desired. If the signal at the input changes its frequency and/or amplitude, the signal filter 3 should be adjusted to a new frequency response. The transition to this new frequency response to be adjusted is, however, not realized steplessly, but with a given dynamic behaviour. This dynamic behavior of analog noise-reduction systems is not explicitly laid down in their specifications. The dynamic behavior is rather the result of given analog circuit structures which have a given dynamic behavior in practice. For the implementation of the circuit arrangement according to the invention, only the dynamic behavior of these analog arrangements can thus be measured and simulated by means of the digital circuit arrangement. Consequently, the digital circuit arrangement may be implemented by experiment. This dynamic behavior is determined by the rise time filter, the decay time filter and the minimum time constants determined by these filters for selecting new coefficients, as well as by the frequency response of the control filter.

In the arrangement according to FIG. 1, a changing signal x(n) will thus generate a new output signal s(n) of the signal filter 7. However, this does not result directly in a corresponding change of the filter coefficients, because the changing signals s(n) and s'(n) are given time constants in the pulse shaper stage 9, with the result that the signal which is subsequently logarithmated in the logarithmation means 12 slowly assumes the new nomimal value. Thus, the new statistical value for the new input signal x(n) is adjusted also in the coefficient-determining circuit 6 after selection of different intermediate values for the filter coefficients and after a period of transition. The periods of transition towards larger or smaller amplitudes or frequencies of the input signal are determined by the time constant of the rise time filter 10 and the decay time filter 11 in the pulse shaper stage 9.

In many noise-reduction systems the signal is limited in dependence upon the amplitude. For example, in Dolby-B systems the signal should be limited at given amplitudes or frequencies at the encoder end, i.e. at the recording end. To cancel this limitation in the decoder at the reproducing end, the arrangement of FIG. 1 includes the multiplier 4 to which the output signal of the pulse shaper stage 9 is applied. This multiplier 4 normally multiplies the signal passing through it by the factor of 1 and thus leaves it uninfluenced. When the circuit arrangement receives signals having an amplitude and/or frequency from which it can be concluded that the signal has been limited at the encoder end, the signal passing through the multiplier 4 is influenced by a factor of >1 so that the limitation at the encoder end is cancelled thereby. It is evident that the multiplier 4 is not required for the basic function of the circuit arrangement and may thus be dispensed with.

Figure 2:
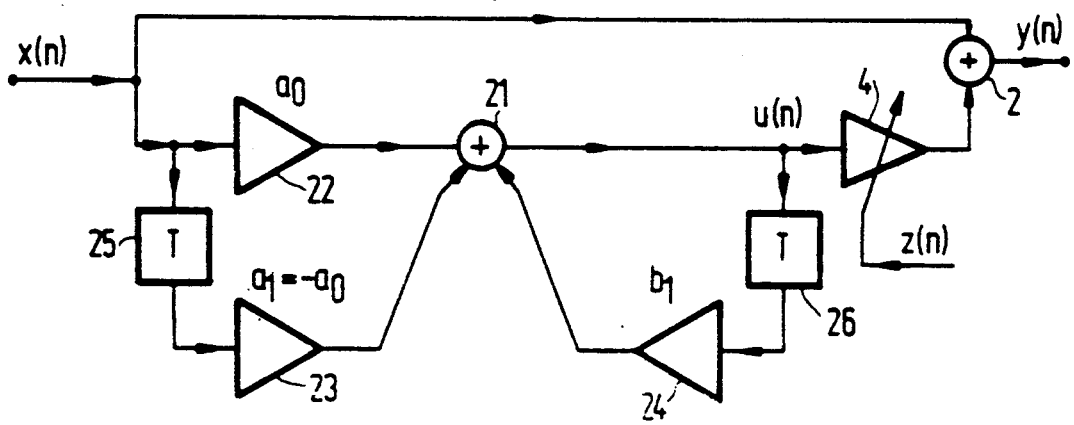
FIG. 2 shows the signal filter of the arrangement of FIG. 1 in greater detail.

FIG. 2 shows the main branch and the sub-branch of the arrangement of FIG. 1 in greater detail. The structure of the signal filter 3 is particularly shown in greater detail. The signal filter 3, which is a first-order digital low-pass filter, comprises an adder 21 which receives the input signal of the circuit arrangement impressed with a filter coefficient $a_0$ in a multiplier 22, the input signal of the circuit arrangement impressed with a filter coefficient $a_1 = -a_0$ in a multiplier 23 and delayed by one clock period in a delay member 25, as well as the output signal u(n) of the adder 21 impressed with a filter coefficient $b_1$ in a multiplier 24 and delayed by one clock period. This signal filter has the transfer function $$H(e^{j\omega T}) = \frac{a_0 - a_0 e^{-j\omega T}}{1 + b_1 e^{-j\omega T}}$$

for generating decoder frequency response characteristics of the Dolby-B system, the filter coefficients $a_0$ and $a_1$ for the multipliers 22 and 23 can be chosen to be equal, except for the sign. Thus, only the filter coefficients $a_0$ and $b_1$ are to be applied to the filter. These filter coefficients are selected in the circuit 6 for determining the coefficients in dependence upon the output signal of the logarithmation means of the arrangement according to FIG. 1.

The output signal u(n) of the adder 21 and hence of the signal filter 3 is applied to the output of the circuit arrangement after it has passed the multiplier 4 and has subsequently been added to the input signal x(n) of the circuit arrangement in the adder 2, and represents the output signal, hence the decoded digital audio signal y(n) of the circuit arrangement.

Figure 3:
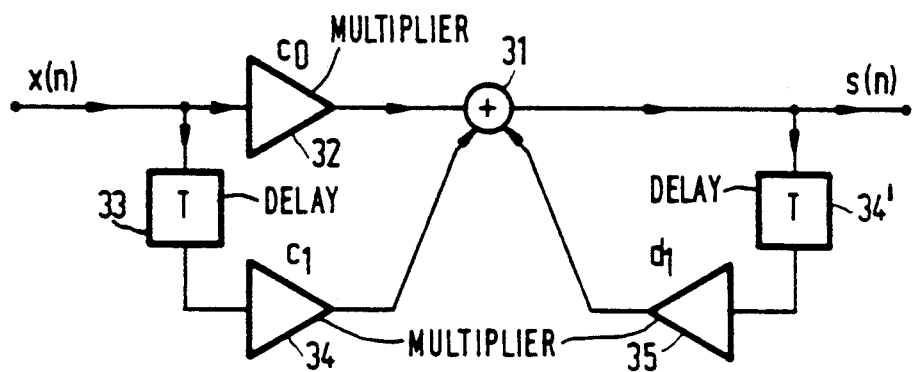
FIG. 3 shows the control filter of the arrangement of FIG. 1 in greater detail.

FIG. 3 shows the control filter 7 of the arrangement of FIG. 1 in greater detail. The digital audio signal x(n) is applied to the input of the filter. The signal filter shown in FIG. 3 is a first-order digital filter implemented as a high-pass filter. Such a high-pass characteristic is required for decoding in accordance with the frequency response characteristics of the Dolby-B system.

The signal filter shown in FIG. 3 includes an adder 31 which receives the input signal x(n) after multiplication by a filter coefficient $x_0$ in a multiplier 32. This input signal x(n) is further delayed in a delay member 33 by one sampling clock period and subsequently impressed with a filter coefficient $c_1$ in a multiplier 34. The output signal of the multiplier 34 is applied to a further input of the adder 31. The output signal of the adder 31 is fed back to an input of the adder 31 via a delay member 34' in which this signal is delayed by one sampling clock period and a subsequent multiplier 35 in which the output signal of the delay member 34' is impressed with a filter coefficient $d_1$. The output signal of the adder 31 simultaneously constitutes the output signal of the signal filter which is denoted by s(n) in the Figure. This filter has the transfer function $$H(e^{j\omega T}) = \frac{c_0 + c_1 e^{-j\omega T}}{1 + d_1 e^{-j\omega T}}$$

The filter coefficients $c_0$, $c_1$ and $d_1$ have constant values and are implemented in such a way that the overall circuit arrangement according to FIG. 1 has the desired static and dynamic behaviour.

Figure 4:
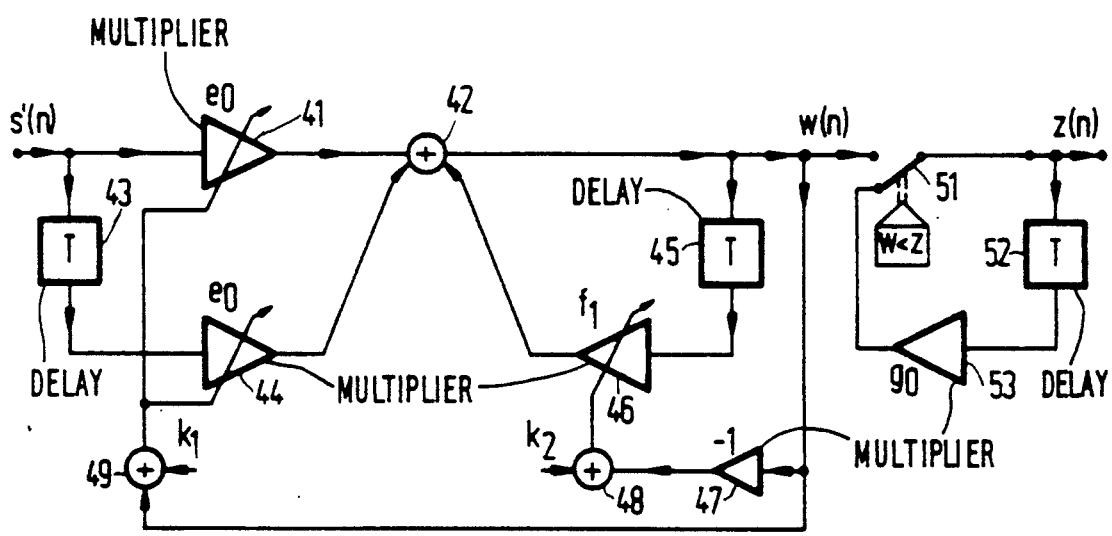
FIG. 4 shows the pulse shaper stage of the arrangement of FIG. 1 in greater detail.

FIG. 4 shows the pulse shaper 9 of FIG. 1 in greater detail. FIG. 4 particularly shows the rise time filter 10 and the decay time filter 11 in greater detail. The rectified output signal s'(n) of the control filter is applied to the input of the pulse shaper shown in FIG. 4. This signal is received at an input of an adder 42 via a multiplier 41 in which a filter coefficient $e_0$ is applied to this signal. The input signal s'(n) delayed by one sampling clock period in a delay member 43 and subsequently impressed with the filter coefficient $e_0$ in a multiplier 44 is applied to a further input of the adder 42. The output signal of the adder 42 is fed back to a further input of the adder 42 via a delay member 45 in which it is delayed by one sampling clock period and via a subsequent multiplier 46 in which a filter coefficient $f_1$ is applied to this signal. The output signal of the adder 42, denoted by $w(n)$ in FIG. 4, also represents the output signal of the rise time filter.

As regards its filter coefficients $e_0$ and $f_1$, the rise time filter is variable. In fact, these filter coefficients $e_0$ and $f_1$ are dependent on the amplitude of the output signal $w(n)$. To this end the signal $w(n)$ is applied to an adder 49 in which it is added to a fixed value $k_1$. The output signal of the adder 49 now represents the filter coefficients $e_0$ for the multipliers 41 and 44.

To gain the filter coefficients $f_1$, the output signal $w(n)$ is inverted in a multiplier 47, i.e. it is multiplied by the value of $-1$ and subsequently added by a fixed value $k_2$ in an adder 48. The output signal of the adder 48 constitutes the filter coefficients $f_1$ for the multiplier 46.

This mode of generating the filter coefficients $e_0$ and $f_1$ results in the filter characteristics of the filter being varied in dependence upon its output signal $w(n)$. Since the rise time filter determines the minimum time constant for rising edges of the signals $s'(n)$ applied to this filter, the dynamic behavior of the overall circuit arrangement according to FIG. 1 can be determined by the selection of the filter coefficients in $e_0$ and $f_1$. Since this behavior should be dependent on amplitudes, for example, for Dolby-B circuits, the filter coefficients $e_0$ and $f_1$ are selected in dependence upon the filter output signal $w(n)$. The value of the filter coefficients $e_0$ and $f_1$ in the rise time filter determines the dynamic behavior of the circuit arrangement in the case of a transition from smaller to larger amplitudes of the digital audio signal or in the case of a transition from lower to higher frequencies of the audio signal.

FIG. 4 further shows the decay time filter 11 of the arrangement of FIG. 1 in greater detail. This is a first-order filter which operates with a constant filter coefficient $g_0$.

A switch 51 represents this filter in FIG. 1, which switch either switches the output signal $w(n)$ of the rise time filter to the decay time filter output or applies the output signal of the decay time filter, denoted by $z(n)$ in the Figure, to the filter output via a delay member 52 in which the signal is delayed by one sampling clock period and via a subsequent multiplier 53 in which the signal passing through this multiplier is impressed with the filter coefficient $g_0$. The switch 51 is selected in dependence upon the value of the signal $w(n)$ in comparison with the value of the signal $z(n)$. During the periods when the signal $w(n)$ has smaller values than the signal $z(n)$, the output signal $z(n)$ is fed back to the output via the delay member 52 and the multiplier 53. During the other periods of time the signal $w(n)$ is directly applied as output signal $z(n)$ to the output of the decay time filter 11.

The output signal $z(n)$ of the decay time filter simultaneously represents the output signal of the pulse shaper stage 9 of FIG. 1.

The selection of the filter coefficients $g_0$ in the decay time filter determines the decay behavior of the circuit arrangement of FIG. 1, i.e. the behaviour at a transition from larger to smaller amplitudes of the digital audio signal or at a transition from higher to lower frequencies of the digital audio signal.

The digital first-order filters have been described as direct form I filters. However, since recursive filters are generally used, these filters may advantageously be realized as digital wave filters in which no stability problems occurs. This particularly applies to the stability behavior under non-linear conditions.

We claim:

1. A digital circuit arrangement for influencing the frequency response of a digital audio signal, dependent on the frequency or amplitude, characterized in that an input signal of the digital circuit arrangement is applied to a signal filter having variable filter coefficients, while an output signal of the signal filter represents the frequency response-influenced output signal of the digital circuit arrangement after addition to the input signal of the digital circuit arrangement, wherein the coefficients for the signal filter are selected in dependence upon the output signal of a control branch which receives the input signal of the digital circuit arrangement and comprises a control filter coupled to an input of the control branch; a rectifier coupled to receive an output signal of said control filter for suppressing negative values in the output signal of said control filter; a pulse shaper stage coupled to receive an output signal of said rectifier for giving time constants to a rise time and a decay time in the output signal of said rectifier; a logarithmation means coupled to receive an output signal of said pulse shaper stage for applying a logarithm function to the output signal of said pulse shaper stage; and a circuit for determining said variable filter coefficients in response to an output signal of said logarithmation means, said variable filter coefficients determining circuit supplying said variable filter coefficients for the signal filter.

2. A digital circuit arrangement as claimed in claim 1, characterized in that the pulse shaper stage comprises a rise time filter and a decay time filter, said rise time filter and said decay time filter being low-pass filters which influence the pulse behavior of the output signal of the rectifier applied to the pulse sharper stage in such a way that the rise time filter defines the minimum time constant of the rising edges of the output signal of the rectifier and the decay time filter defines the minimum time constant of the falling edges of the output signal of the rectifier.

3. A digital circuit arrangement as claimed in claim 2, characterized in that said minimum time constant of the rising edges of the output signal of the rectifier varies in dependence upon the amplitude of the output signal of the rectifier applied to said rise time filter, wherein said minimum time constant of the rising edges of the output signal of the rectifier becomes smaller as the amplitude of the output signal of the rectifier becomes larger.

4. A digital circuit arrangement as claimed in claim 2, characterized in that the rise time filter is a first-order digital filter having the transfer function $$H(e^{j\omega T}) = \frac{e_0 + e_0 e^{-j\omega T}}{1 + f_1 e^{-j\omega T}}$$

where $T=1/F$, $F=$ sampling frequency of the digital audio signal, $\omega = 2\pi F$, $e_0 = k_1 +$ output signal of the rise time filter, and $f_1 = k_2 +$ inverted output signal of the rise time filter, $k_1$ and $k_2$ being constants.

5. A digital circuit arrangement as claimed in claim 1, characterized in that the control filter is a high-pass filter.

6. A digital circuit arrangement as claimed in claim 1, characterized in that the control filter is a first-order digital filter having the transfer function $$H(e^{j\omega T}) = \frac{c_0 + c_1 e^{-j\omega T}}{1 + d_1 e^{-j\omega T}}$$

where $T=1/F$, $F=$sampling frequency of the digital audio signal, $\omega=2\pi F$, and filter coefficents $c_0$, $c_1$, $d_1$ have constant values.

7. A digital circuit arrangement as claimed in claim 1, characterized in that the signal filter is a first-order digital filter having the following transfer function:

$$H(e^{j\omega T}) = \frac{a_0 - a_0 e^{-j\omega T}}{1 + b_1 e^{-j\omega T}}$$

where $T=1/F$, $F=$sampling frequency of the digital audio signal, $\omega=2\pi F$, and in that the coefficients $a_0$ and $b_1$ of the signal filter are variable and are selected in dependence upon the output signal of the logarithmation means.

8. A digital circuit arrangement as claimed in claim 1, characterized in that said circuit for determining said variable filter coefficients comprises a read-only memory which is controlled by the output signal of the logarithmation means, and in that 100 values of the variable filter coefficients required for the signal filter are stored in said read-only memory.

9. A digital circuit arrangement as claimed in claim 7, characterized in that said circuit for determining said variable filter coefficient computes the variable filter coefficients required for the signal filter in dependence upon the output signal of the logarithmation means by means of predetermined mathematical equations.

10. A digital circuit arrangement as claimed in claim 9, characterized in that the variable filter coefficients $a_0$ and $b_1$ are computed by means of the following equations:

$$a_0 = L_1 \cdot f(z) + l_2$$

$$b_1 = L_3 \cdot f(z) + L_4$$

in which f(z) is the output signal of the logarithmation means and $L_1$ to $L_4$ have predetermined constant values.

11. A digital circuit arrangement as claimed in claim 1, characterized in that the logarithmation means performs a modified logarithmation and computes from its input signal z an output signal f(z) in accordance with the equation $$f(z) = A + Bz^{\frac{1}{4}} + Cz^{\frac{1}{2}} + Dz$$

in which A, B, C and D have constant values.

12. A digital circuit arrangement as claimed in claim 1, characterized in that the characteristics of the digital circuit arrangement for influencing the frequency response are in conformity with the characteristics of an analog Dolby-B noise reduction circuit.

13. A digital circuit arrangement as claimed in claim 12, characterized in that when the circuit arrangement is used for decoding in conformity with the characteristics of an analog Dolby-B circuit, the signal filter is a first-order low-pass filter.

14. A digital circuit arrangement as claimed in claim 1, characterized in that, prior to addition to the input signal of the digital circuit arrangement, the output signal of the signal filter is applied to a multiplier in which the signal is multiplied by a value of 1 when it falls below a predetermined amplitude value and is multiplied by a value of slightly more than 1 when it exceeds the predetermined amplitude value.

15. A digital circuit arrangement as claimed in claim 1, characterized in that the characteristics of the digital circuit arrangement for influencing the frequency response are in conformity with the characteristics of an analog Dolby-C circuit and in that the signal filter and the control filter are second-order digital filters.

16. A digital circuit arrangement as claimed in claim 3, characterized in that the rise time filter is a first-order digital filter having the transfer function $$H(e^{j\omega T}) = \frac{e_0 + e_0 e^{-j\omega T}}{1 + f_1 e^{-j\omega T}}$$

where $T=1/F$, $F=$sampling frequency of the digital audio signal, $\omega=2\pi F$, $e_0 = k_1 +$output signal of the rise time filter, and $f_1 = k_2 +$inverted output signal of the rise time filter, $k_1$ and $k_2$ being constants.

* * * * *